US012701761B2

(12) United States Patent
Siemieniec et al.

(10) Patent No.: US 12,701,761 B2
(45) Date of Patent: Aug. 4, 2026

(54) SiC MOSFET WITH REDUCED ON-RESISTANCE

(71) Applicant: Infineon Technologies AG, Neubiberg (DE)

(72) Inventors: Ralf Siemieniec, Villach (AT); Thomas Aichinger, Faak am See (AT); Ravi Keshav Joshi, Klagenfurt (AT); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 837 days.

(21) Appl. No.: 17/671,838

(22) Filed: Feb. 15, 2022

(65) Prior Publication Data

US 2022/0262906 A1      Aug. 18, 2022

(30) Foreign Application Priority Data

Feb. 17, 2021    (DE) .......................... 102021103788.3

(51) Int. Cl.
| | |
|---|---|
| *H10D 62/832* | (2025.01) |
| *H10D 12/01* | (2025.01) |

(Continued)

(52) U.S. Cl.
CPC ....... *H10D 62/8325* (2025.01); *H10D 12/031* (2025.01); *H10D 30/668* (2025.01);

(Continued)

(58) Field of Classification Search
CPC ............... H01L 29/1608; H01L 21/046; H01L 29/4236; H01L 29/66068; H01L 29/7813;

(Continued)

(56) References Cited

U.S. PATENT DOCUMENTS

| | | | |
|---|---|---|---|
| 2005/0110098 | A1 | 5/2005 | Yoshihara |
| 2006/0273379 | A1 | 12/2006 | Bhalla et al. |

(Continued)

FOREIGN PATENT DOCUMENTS

| | | |
|---|---|---|
| CN | 1643690 A | 7/2005 |
| CN | 101964362 A | 2/2011 |

(Continued)

OTHER PUBLICATIONS

C. Strenger, et al. "Influence of ion implantation in SiC on the channel mobility in lateral n-channel MOSFETs", The Electrochemical Society, ECS Transactions, 58 (4), 2013, pp. 71-80.

(Continued)

*Primary Examiner* — Raj R Gupta
(74) *Attorney, Agent, or Firm* — Cooper Legal Group LLC

(57) ABSTRACT

A silicon carbide (SiC) metal-oxide-semiconductor field-effect transistor (MOSFET) and a method for forming a SiC MOSFET are disclosed. In an example, the method includes forming a gate dielectric that adjoins a body region arranged in a semiconductor body, and forming a gate electrode on the gate dielectric. Forming the gate electrode includes forming a first electrode layer, implanting work function adjusting atoms into the first electrode layer, and forming a second electrode layer on the first electrode layer.

17 Claims, 4 Drawing Sheets

(51) Int. Cl.

| | |
|---|---|
| *H10D 30/66* | (2025.01) |
| *H10D 64/27* | (2025.01) |
| *H10P 30/20* | (2026.01) |

(52) U.S. Cl.
CPC ....... *H10D 64/513* (2025.01); *H10P 30/2042* (2026.01); *H10P 30/21* (2026.01)

(58) Field of Classification Search
CPC .......... H01L 29/1095; H01L 29/41766; H01L 29/4958; H01L 29/4966; H01L 29/7397; H01L 21/049; H01L 29/401; H01L 29/42356; H01L 29/7827; H10D 62/8325; H10D 64/513; H10D 30/668; H10D 62/393; H10D 64/2527; H10D 64/256; H10D 64/667; H10D 64/669; H10D 12/481; H10D 64/01; H10D 64/512; H10D 30/63; H10D 12/01; H10D 12/031; H10D 12/035; H10D 12/038; H10D 18/01; H10D 18/021; H10D 18/031; H10D 30/028; H10D 30/0281; H10D 30/0285; H10D 30/0287; H10D 30/0289; H10D 30/0291; H10D 30/0293; H10D 30/0295; H10D 30/0297; H10D 64/666; H10D 64/665; H10P 30/00

See application file for complete search history.

(56) References Cited

U.S. PATENT DOCUMENTS

| | | | | |
|---|---|---|---|---|
| 2007/0075351 | A1* | 4/2007 | Schulz | ............... H01L 27/1211 257/E21.639 |
| 2007/0114616 | A1 | 5/2007 | Manger et al. | |
| 2010/0078707 | A1 | 4/2010 | Haeberlen et al. | |
| 2011/0186931 | A1* | 8/2011 | Marxsen | ........... H10D 84/0167 257/E27.06 |
| 2013/0240996 | A1 | 9/2013 | Yin et al. | |
| 2014/0014972 | A1 | 1/2014 | Nakano et al. | |
| 2014/0367774 | A1* | 12/2014 | Yoo | ...................... H10D 64/513 257/330 |
| 2015/0097250 | A1* | 4/2015 | Cheon | .................. H10D 84/834 257/401 |
| 2016/0225675 | A1 | 8/2016 | Shen et al. | |
| 2017/0125532 | A1* | 5/2017 | Jang | ..................... H10B 12/053 |
| 2017/0236910 | A1 | 8/2017 | Laforet et al. | |
| 2017/0301544 | A1 | 10/2017 | Chi et al. | |
| 2019/0172910 | A1 | 6/2019 | Siemieniec et al. | |
| 2019/0371675 | A1 | 12/2019 | Tsai et al. | |
| 2020/0020690 | A1 | 1/2020 | Ando et al. | |
| 2021/0043521 | A1* | 2/2021 | Chiu | .................... H10D 84/853 |
| 2022/0254892 | A1 | 8/2022 | Bhandari et al. | |

FOREIGN PATENT DOCUMENTS

| | | | | |
|---|---|---|---|---|
| CN | 103311247 | A | 9/2013 | |
| CN | 104979180 | A * | 10/2015 | ........... H01L 29/401 |
| CN | 104167359 | B * | 5/2018 | ....... H01L 29/66545 |
| CN | 109873030 | A | 6/2019 | |

OTHER PUBLICATIONS

Chinese Office Action from Corresponding Chinese Patent Application No. 202210146235.6, dated May 26, 2026.

* cited by examiner

FORMING A GATE DIELECTRIC THAT ADJOINS A BODY REGION ARRANGED IN A SEMICONDUCTOR BODY — 201

FORMING A GATE ELECTRODE ON TOP OF THE GATE DIELECTRIC, WHEREIN FORMING THE GATE ELECTRODE INCLUDES FORMING A FIRST ELECTRODE LAYER; IMPLANTING WORK FUNCTION ADJUSTING ATOMS INTO THE FIRST ELECTRODE LAYER; AND FORMING A SECOND ELECTRODE LAYER ON THE FIRST ELECTRODE LAYER — 202

SiC MOSFET WITH REDUCED ON-RESISTANCE

RELATED APPLICATION

This application claims priority to German Patent Application No. 102021103788.3, filed on Feb. 17, 2021, entitled "SIC MOSFET WITH REDUCED ON-RESISTANCE", which is incorporated by reference herein in its entirety.

SUMMARY

This disclosure relates in general to a silicon carbide (SiC) metal-oxide-semiconductor field-effect transistor (MOSFET).

A SiC MOSFET is a voltage controlled transistor device that may be used in various types of electronic applications that require electronic switches with a voltage blocking of more than 400 volts (V) and up to several kilovolts (kV). Examples of such applications include battery chargers, solar inverters, industrial power supplies, or the like.

In addition to the voltage blocking capability, a key parameter of a SiC MOSFET is the area specific on-resistance Ron·A, which may briefly be referred to as specific on-resistance. The specific on-resistance is the resistance of the MOSFET in an on-state (switched on state) multiplied with an area of a SiC die required to implement the MOSFET.

There is a need to reduce the specific on-resistance of a SiC MOSFET.

An example relates to a method for forming a SiC MOSFET. The method includes forming a gate dielectric that adjoins a body region arranged in a semiconductor body, and forming a gate electrode on the gate dielectric. Forming the gate electrode includes forming a first electrode layer, implanting work function adjusting atoms into the first electrode layer, and forming a second electrode layer on the first electrode layer.

An example relates to a SiC MOSFET. The SiC MOSFET includes at least one transistor cell. The at least one transistor cell includes a gate dielectric adjoining a body region, and a gate electrode adjoining the gate dielectric, wherein a work function of the gate electrode is greater than 4.1 electron volts (eV).

DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the disclosed subject matter may be used and implemented. It is to be understood that the features of the various embodiments described herein may be combined with each other, unless specifically noted otherwise.

Figure 1:
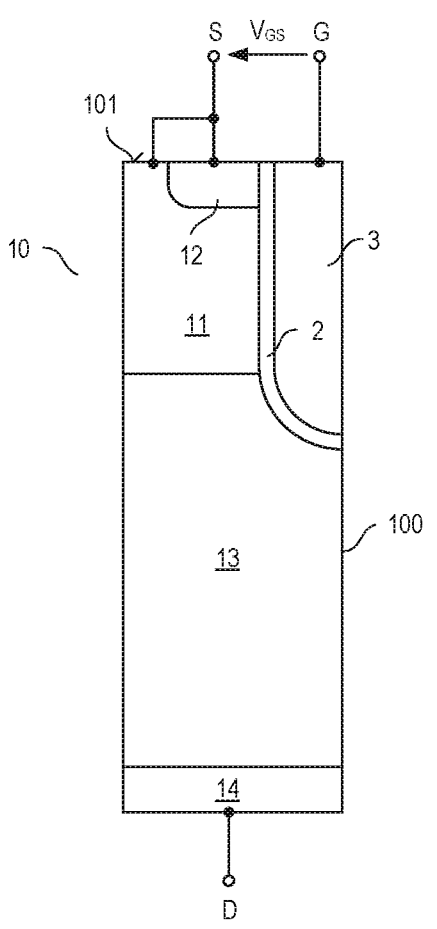
FIG. 1 shows a silicon carbide (SiC) metal-oxide-semiconductor field-effect transistor (MOSFET) transistor cell with a trench gate electrode according to one example.
Figure 2:
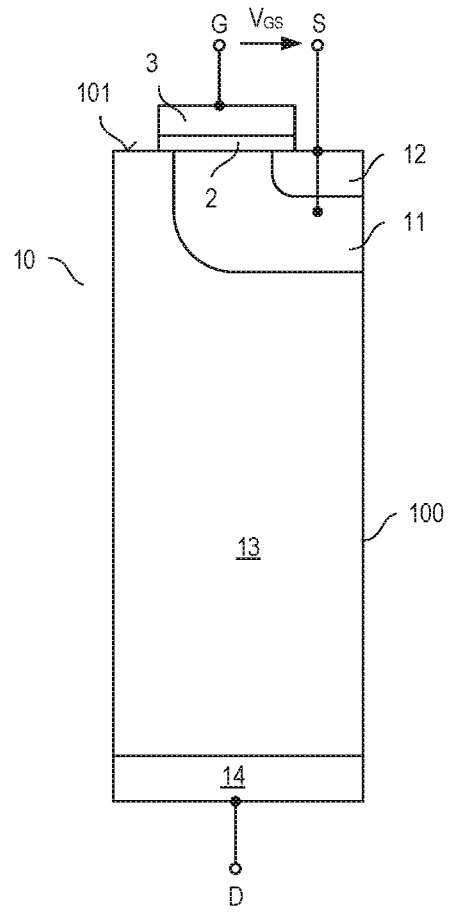
FIG. 2 shows a SiC MOSFET transistor cell with a planar gate electrode according to one example.

FIGS. 1 and 2 each schematically illustrate one example of a transistor cell of a silicon carbide (SiC) metal-oxide-semiconductor field-effect transistor (MOSFET). Each of these transistor cells includes active device regions in a SiC semiconductor body 100. These active device regions include a body region 11 of a first doping type and a source region 12, a drift region 13, and a drain region 14 of a second doping type complementary to the first doping type. The body region 11 is arranged between the source region 12 and the drift region 13. The drift region 13 is arranged between the body region 11 and the drain region 14. A pn-junction is formed between the body region 11 and the drift region 13. Further, each transistor cell 10 includes a gate electrode 3 that is arranged adjacent to the body region 11 and that is dielectrically insulated from the body region 11 (and the source region 12 and the drift region 13) by a gate dielectric 2.

The transistor cells shown in FIGS. 1 and 2 are different with regard to the implementation of the gate electrode 3 and the gate dielectric 2. The transistor cell according to FIG. 1 is a trench transistor cell. In this example, the gate electrode 3 and the gate dielectric 2 are arranged in a trench that extends from a first surface 101 of the semiconductor body 100 through the body region 11 into the drift region 13. A direction of the semiconductor body 100 perpendicular to the first surface 101 is referred to as vertical direction in the following, and directions parallel to the first surface 101 are referred to as horizontal or lateral directions in the following. In the trench transistor cell according to FIG. 1, the body region 11 is adjacent the gate electrode 3 in a horizontal direction of the semiconductor body 100.

In the transistor cell according to FIG. 2, the gate dielectric 2 and the gate electrode 3 are arranged above the first surface 101 of the semiconductor body 100. In this example, the drift region 11 includes a section that extends to the first surface 101. Further, the body region 11 is arranged adjacent to the gate electrode 3 in the vertical direction of the semiconductor body 100.

Each of the transistor cells shown in FIGS. 1 and 2 is a vertical transistor cell. That is, each of the source region 12 and the body region 11 is spaced apart from the drift region 14 in the vertical direction of the semiconductor body 100.

The SiC MOSFET include a plurality of transistor cells that are either of the type shown in FIG. 1 or the type shown in FIG. 2, wherein these transistor cells have their active device regions integrated in the same semiconductor body 100. The individual transistor cells are connected in parallel. For this, the gate electrodes 3 of the individual transistor cells are connected to a common gate node G, the source and body regions 12, 11 of the individual transistor cells are connected to a common source node S, and the drain regions 4 are connected to a common drain node D. According to one example, the drift regions 13 of the individual transistor cells of the SiC MOSFET are formed by one contiguous semiconductor region. In some examples, the drain regions 14 of the individual transistor cells may be formed by one contiguous semiconductor region. This is explained in detail herein further below.

The SiC MOSFET can be implemented as an n-type MOSFET or as a p-type MOSFET. In an n-type MOSFET, the body region 11 is p-doped and the source, drift and drain regions 12, 13, 14 are n-doped. In a p-type MOSFET, the doping types of the individual device regions are complementary to the doping type of the respective device regions in an n-type MOSFET.

Each of the transistor cells 10 shown in FIGS. 1 and 2 can be switched on or off by applying a drive voltage $V_{GS}$ (e.g., a suitable drive voltage $V_G$s) between the gate node G and the source node S. The transistor cell 10 (and/or a transistor device comprising the transistor cell 10) is in an on-state when the drive voltage $V_{GS}$ is above a respective threshold voltage Vth. The transistor cell 10 (and/or the transistor device) is in an off-state when the drive voltage $V_{GS}$ is below the threshold voltage Vth. In the on-state, a conducting channel is generated by field-effect in the body region 11 along the gate dielectric 2 between the source region 12 and the drift region 13, so that the transistor cell can conduct a current between the drain node D and the source node S when a voltage is applied between the drain node D and the source node S. In the off-state, the conducting channel is interrupted so that a current flow between the drain node D and the source node S is prevented when a voltage is applied between the drain node D and the source node S that forward biases the MOSFET. The MOSFET is forward biased, when the voltage between the drain node D and the source node S, which is also referred to as drain-source voltage in the following, reverse biases the pn junction between the body region 11 and the drift region 13. The MOSFET is reverse biased, when the drain-source voltage is such that in the off-state the pn-junction between the body region 11 and the drift region 13 is forward biased. In this operating mode the MOSFET is configured to conduct a current (which is often referred to as reverse current) between the drain node D and the source node S independent of the drive voltage $V_{GS}$.

An electrical resistance of the transistor cell 10 between the drain node D and the source node S in the on-state is referred to as on-resistance. Referring to the above, the transistor device is in the on-state when the drive voltage $V_{GS}$ is higher than the threshold voltage. Further increasing the drive voltage $V_{GS}$ after the drive voltage $V_{GS}$ has crossed the threshold voltage Vth usually decreases the on-resistance, wherein increasing the drive voltage $V_{GS}$ to above a certain voltage level higher than the threshold voltage does not significantly reduce the on-resistance (e.g., does not reduce the on-resistance by a threshold amount) any further. This certain voltage level (which is usually given in the data sheet of the device) may be referred to as recommended drive voltage level. Usually, the on-resistance is the electrical resistance of the transistor cell when the drive voltage $V_{GS}$ has the recommended drive voltage level. This, however, is only an example. Some and/or all of the techniques and/or description provided herein with regard to reducing the on-resistance may apply to the on-resistance at any other drive voltage level higher than the threshold voltage Vth as well.

The on-resistance of a MOSFET that includes a plurality of transistor cells is given by the resistance of the parallel connection of the individual transistor cells, wherein the on-resistance decreases as the number of transistor cells increases. The area specific on-resistance of the MOSFET is given by the on-resistance multiplied with the semiconductor area of the MOSFET. The semiconductor area is the area, in a plane parallel to the first surface 101, required to implement the transistor cells of the MOSFET in the semiconductor body 100.

In a transistor cell of a SiC MOSFET, the on-resistance of the transistor cell is mainly given by the electrical resistance of the drift region 13 between the body region 11 and the drain region 14 and by the channel resistance. The "channel resistance" is the electrical resistance of the conducting channel that forms along the gate dielectric 2 between the source region 12 and the drift region 13 when a drive voltage $V_{GS}$ higher than the threshold voltage Vth is applied. In a SiC MOSFET, the channel resistance contributes (e.g., significantly contributes) to the overall on-resistance of the transistor cell 10.

It has been found that the channel resistance can be decreased by reducing the doping concentration of the body region 11. Reducing the doping concentration of the body region 11 increases the charge carrier mobility of the charge carriers in the channel region and therefore reduces the resistance of the channel region.

The body region 11 is formed by an implantation process in which dopant atoms are implanted via the first surface 101 into the semiconductor body 100, and by activating the implanted dopant atoms. By reducing the implantation dose in the implantation process, the doping concentration of the body region 11 is reduced so that the channel resistance is reduced and the on-resistance of the transistor cell 10 is reduced.

Activating the implanted dopant atoms includes an annealing process. According to one example, a temperature in the annealing process is between 1600° C. and 1800° C., and the duration of the annealing process is between 20 minutes and 40 minutes.

Reducing the doping concentration of the body region 11, however, affects the threshold voltage of the MOSFET. For example, reducing the doping concentration of the body region 11 in order to reduce the channel resistance causes a reduction of the threshold voltage Vth. This, however, is not desirable in many applications. A change of the threshold voltage may require a redesign of drive circuits used to drive the MOSFET, for example. Furthermore, in some applications the threshold voltage should be high enough to ensure blocking (off-state) at high drain bias and elevated temperatures.

There is therefore a need to reduce the on-resistance of the SiC MOSFET without significantly affecting the threshold voltage (e.g., reduce the on-resistance without changing the threshold voltage by over a threshold amount). This can be achieved by reducing the implantation dose of the body region 11 and, at the same time, adjusting (e.g., suitably adjusting) the work function of the gate electrode 3. The work function of the gate electrode 3 affects the threshold voltage Vth of the MOSFET. One example of a method for adjusting (e.g., suitably adjusting) the work function in order to counteract a reduction of the threshold voltage Vth by reducing the implantation dose is illustrated in FIG. 3.

Figure 3:
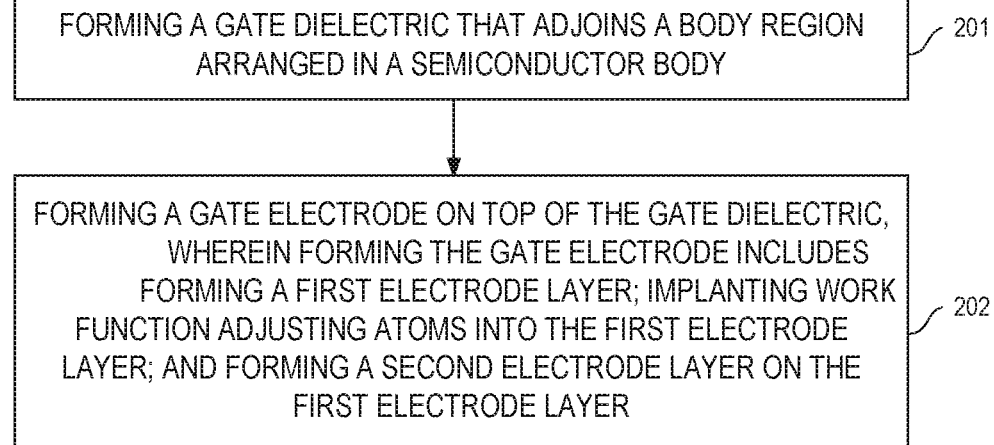
FIG. 3 shows a flowchart that illustrates one example of a method for forming a gate with a gate dielectric and a gate electrode.

Referring to FIG. 3, the method includes forming a gate dielectric that adjoins a body region of the MOSFET (see 201 of FIG. 3). Furthermore, the method includes forming a gate electrode on top of the gate dielectric, wherein forming the gate electrode includes forming a first electrode layer, implanting work function adjusting atoms into the first electrode layer, and forming a second electrode layer on the first electrode layer (see 202 of FIG. 3).

One example of the method of FIG. 3 is illustrated in FIGS. 4A to 4D, wherein each of these figures schematically illustrates a vertical cross sectional view of a transistor cell 10 during the process of forming the gate dielectric 2 and the gate electrode 3. Just for the purpose of illustration, the transistor cell 10 formed by the process illustrated in FIGS.

4A to 4D is a trench transistor cell of the type shown in FIG. 1. This, however, is only an example. Equivalent process acts may be used to form a transistor cell 10 with a planar gate electrode of the type shown in FIG. 2, or to form a transistor cell of a SiC based MOSFET that is implemented as a fin field-effect transistor (FinFET). The latter is a transistor device in which the body region is located in an elongated fin made of SiC and the gate electrode adjoins sidewalls of the fin adjacent to the body region.

Further, it should be noted that the method is not restricted to be used in the process of forming a MOSFET but may also be used for forming any other kind of SiC based gate controlled transistor device such as an insulated-gate bipolar transistor (IGBT).

Figure 4A:
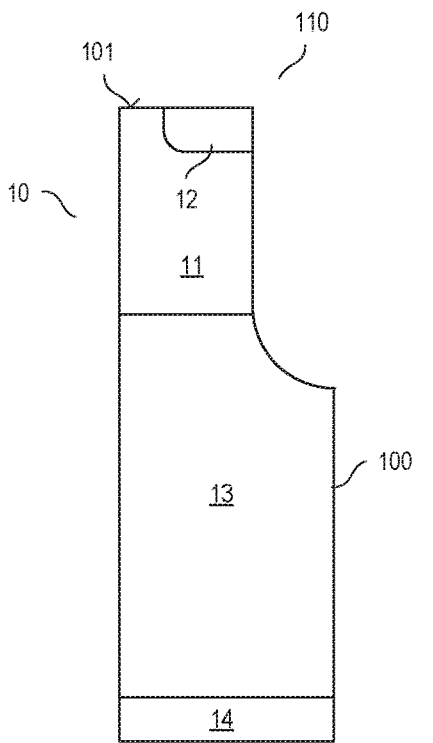
FIGS. 4A-4D schematically illustrate a vertical cross sectional view of a semiconductor body during method acts of a method according to FIG. 3.

Referring to FIG. 4A, the method includes forming a trench 110 in the first surface 101 of the semiconductor body 100 after the body region 11 and the source region 12 have been formed. Forming the body region 11 includes implanting dopant atoms via the first surface 101 into the semiconductor body 100 and activating the implanted dopant atoms. In some examples, forming the source region 12 includes implanting dopant atoms of the second doping type via the first surface 101 into the semiconductor body 100 and activating the dopant atoms of the second dopant type. The dopant atoms of the body region 11 and the source region 12 may be activated in the same activation process. Forming the trench 110 may include a trench etching process. FIG. 4A only shows a section of the semiconductor body 100, namely a section that includes one transistor cell 10. In the example shown in FIG. 4A, the illustrated section of the semiconductor body 100 only includes a section of the trench 110.

Figure 4B:
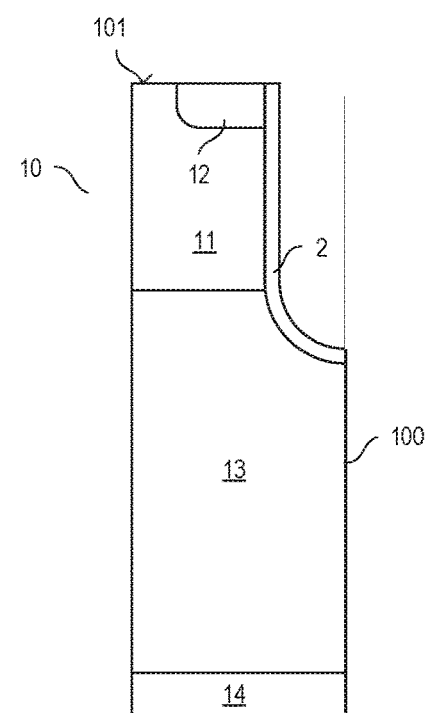

Referring to FIG. 4B, the method further includes forming the gate dielectric 2 on sidewalls and a bottom of the trench 110. Forming the gate dielectric 2 may include a deposition process in which the gate dielectric 2 is deposited on the sidewalls and the bottom of the trench 110. According to one example, the gate dielectric comprises silicon oxide ($SiO_2$). According to another example, the gate dielectric 2 is thermally grown.

According to one example, the method, after forming the gate dielectric 2, further includes performing an annealing process that may improve the quality of an interface between the semiconductor body 100 and the gate dielectric 2.

Figure 4C:
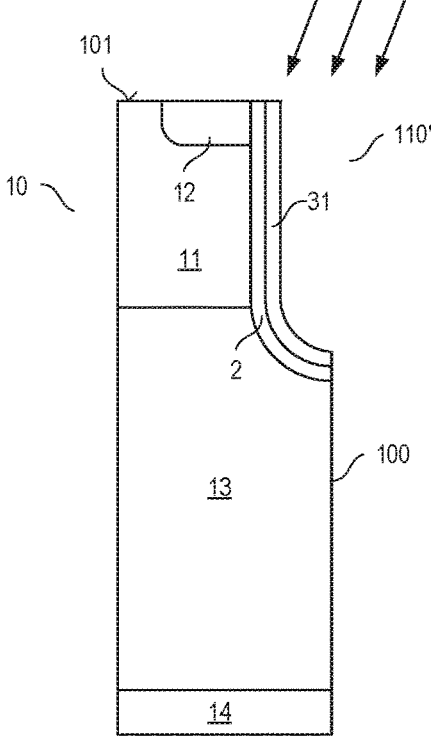

Referring to FIG. 4C, the method further includes forming a first gate electrode layer 31 on the gate dielectric 2 and implanting work function adjusting atoms into this first electrode layer 31. According to one example, a thickness of this first electrode layer 31 is between 5 nanometers (nm) and 100 nanometers, such as between 10 nanometers and 50 nanometers. The first electrode layer 31 may include a metal, a metal alloy, a metal nitride, and/or a metal carbide. The metal may be titanium (Ti), molybdenum (Mo), or tantalum (Ta). The metal alloy may be titanium aluminide (TiAl), or tungsten titanium (TiW). The metal nitride may be titanium nitride (TiN), tantalum nitride (TaN), tungsten nitride (WN), or molybdenum nitride (MoN). The carbide may be titanium carbide (TiC).

The work function adjustment atoms may include nitrogen (N) atoms and/or fluorine (F) atoms, such as one of nitrogen (N) atoms or fluorine (F) atoms.

According to one example, an implantation dose of the work function adjustment atoms is selected such that the work function of the gate electrode 2 is greater than 4.1 electron volts (eV). According to one example, this can be achieved by selecting the implantation dose of the work function adjustment atoms from between $1 \cdot 10^{14}$ centimeters$^{-2}$ (cm$^{-2}$) (1E14 cm$^{-2}$) and $1 \cdot 10^{17}$ cm$^{-2}$ (1E17 cm$^{-2}$), for example between $5 \cdot 10^{14}$ cm$^{-2}$ (5E14 cm$^{-2}$) and $5 \cdot 10^{15}$ cm$^{-2}$ (5E15 cm$^{-2}$) and/or between $1 \cdot 10^{15}$ cm$^{-2}$ (1E15 cm$^{-2}$) and $5 \cdot 10^{15}$ cm$^{-2}$ (5E15 cm$^{-2}$).

Figure 4D:
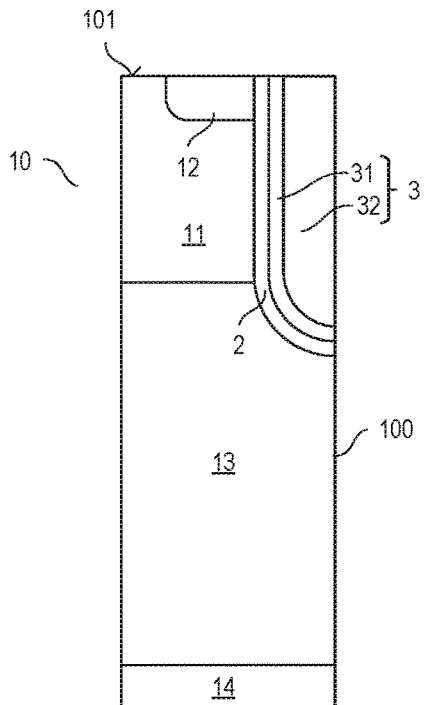

A thickness of the first electrode layer 31 is adapted to the trench size such that after forming the first electrode layer 31 a residual trench 110' remains. Referring to FIG. 4D, the method further includes forming a second electrode layer 32 on the first electrode layer 31. Forming this second electrode layer 32 may fill the residual trench 110'. The first electrode layer 31 and the second electrode layer 32 form the gate electrode 3 of the transistor cell 10. The second electrode layer 32 may include a gate electrode material such as tungsten (W) or doped polysilicon. Polysilicon may be n-doped or p-doped. Dopant atoms in n-doped polysilicon are phosphorous (P) atoms, for example, and dopant atoms in p-doped polysilicon are boron (B) atoms, for example.

In a gate electrode 3 of the type shown in FIG. 4D, which includes the first electrode layer 31 and the second electrode layer 32, the first electrode layer 31 with the implanted work function adjustment atoms increases the work function of the gate electrode 3 as compared to a gate electrode that would only include the second electrode layer 32. This increase of the work function of the gate electrode 3 counteracts a decrease of the threshold voltage Vth which may result from a reduction of the implantation dose of the body region 11. According to one example, the implantation dose of the body region 11 is less than $1.3 \cdot 10^{13}$ cm$^{-2}$ (1.3E13 cm$^{-2}$) and/or less than $1.2 \cdot 10^{13}$ cm$^{-2}$ (1.2E13 cm$^{-2}$).

Referring to the above, the MOSFET may include a plurality of transistor cells connected in parallel. Different examples of SiC MOSFETs that each include a plurality of transistor cells are explained with reference to FIGS. 5 to 7. Each of these figures shows a vertical cross sectional view of one section of the semiconductor body 100 that includes several transistor cells. The MOSFET according to each of the examples shown in FIGS. 5 to 7 includes trench transistor cells. This, however, is only an example. Each of these MOSFETs may easily be adapted to include planar transistor cells.

Figure 5:
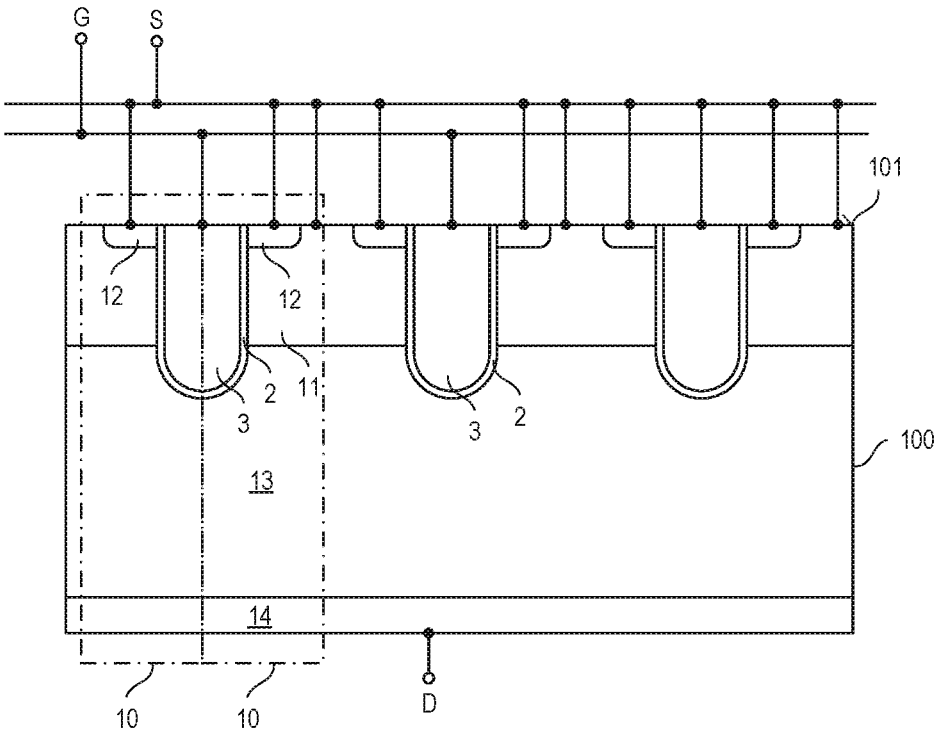
FIGS. 5-7 schematically illustrate different examples of SiC MOSFETs each including a plurality of transistor cells.

In the example shown in FIG. 5, the individual transistor cells 10 are implemented such that the gate electrodes of two neighboring transistor cells are formed by the same trench electrode, wherein the body region of one transistor cell adjoins the trench with the gate electrode 3 on one side and the body region 11 of another transistor cell adjoins the trench with the gate electrode 3 on an opposite side. Further, in this MOSFET, the drift regions 13 of the individual transistor cells are formed by one contiguous semiconductor region, and the drain regions 14 of the individual transistor cells are formed by one contiguous semiconductor region. Furthermore, in the MOSFET according to FIG. 5, the body regions 11 of two neighboring transistor cells are formed by a semiconductor region arranged between the gate trenches of the two transistor cells. The body region 11 may be formed by a blanket implantation, that is, an implantation process in which dopant atoms are implanted into the overall surface 101 of the semiconductor body 100. Forming the source regions 12 may include forming implantation masks on top of the first surface 101, so that dopant atoms are implanted into selected regions of the first surface 101 (e.g., the implantation masks may be formed so that dopant atoms are implanted only into the selected regions of the first surface 101).

Figure 6:
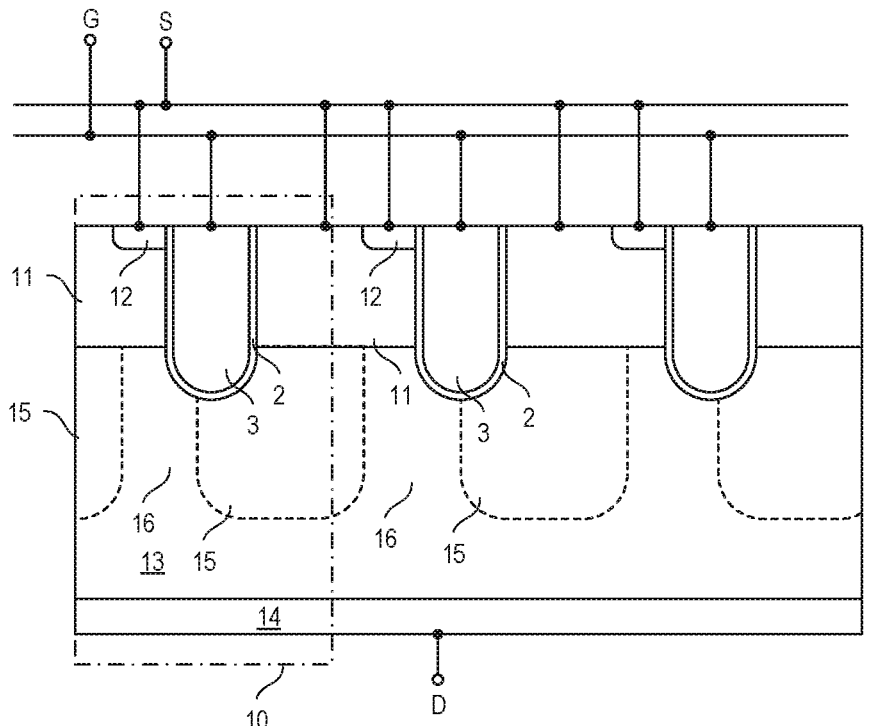

FIG. 6 shows a MOSFET according to another example. In this example, each transistor cell includes a body region 11 and a source region 12 that are arranged adjacent to one side of a gate trench with a gate electrode 3. In some examples, on the opposite side of the gate trench, the body region 11 of a neighboring transistor cell but no source region adjoins the gate trench (e.g., only the body region 11 of the neighboring transistor cell adjoins the opposite side of the gate trench). Furthermore, this MOSFET includes doped semiconductor regions 15 of the second doping type that, below the body regions 15, extend into the drift region 13 towards the drain region 14. These semiconductor regions 15 are connected to the source node S via the body regions 11. Regions 16 of the drift region 13 that are located between neighboring semiconductor regions 15 of the second doping type are referred to as drift channel regions 16 in the following. Each of these drift channel regions 16 adjoins a respective body region 11 in a section of the semiconductor body 100 in which the body region 11 adjoins the gate dielectric 2, so that the drift channel region 16 adjoins the channel region in the body region 11 (and the gate dielectric 2).

The drift channel regions 16 and the further semiconductor regions 15 form a JFET (Junction Field-Effect Transistor). When the transistor device is in the off-state and a voltage is applied between the drain node D and the source node S that forward biases the transistor device, the semiconductor regions 15 pinch off the drift channel regions 16 as the voltage applied between the drain node D and the source node S increases. This may help to protect the gate dielectrics 2 from overvoltages. Referring to FIG. 6, each of the further semiconductor regions 15 may include a section that adjoins a respective gate dielectric 2 at the bottom of the respective gate trench.

Figure 7:
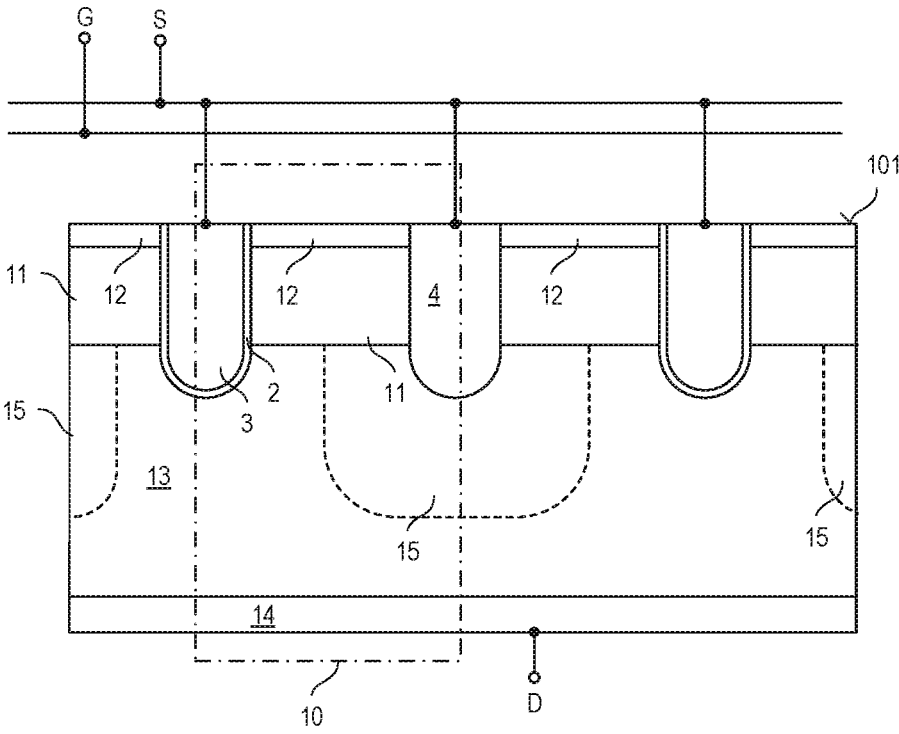

FIG. 7 shows a modification of the transistor device shown in FIG. 6. In the MOSFET according to FIG. 7, source regions adjoin the gate trenches on both sides. Additionally, the MOSFET according to FIG. 7 includes a contact trench 4 that extends from the first surface 101 through the body region 11. This contact trench includes a contact electrode 4 that is connected to the source node S. The contact trench adjoins the source regions 12 and the body regions 11 of two neighboring transistor cells so that these source and body regions 12, 11 are connected to the source node S via the contact trench 4. In some examples, the transistor device comprises a further semiconductor region 15. The contact trench 4 may adjoin the further semiconductor region 15 so that the further semiconductor region 15 is connected to the source node S via the contact electrode 4 in the contact trench.

The gate electrode 3 in each of the examples illustrated in FIGS. 5 to 7 may be implemented in accordance with the method explained with reference to FIG. 3 and FIGS. 4A to 4D.

Although the present disclosure is not so limited, the following numbered examples demonstrate one or more aspects of the disclosure.

Example 1. A method for forming a SiC MOSFET, wherein the method comprises: forming a gate dielectric that adjoins a body region arranged in a semiconductor body; and forming a gate electrode on the gate dielectric, wherein forming the gate electrode comprises: forming a first electrode layer; implanting work function adjusting atoms into the first electrode layer; and forming a second electrode layer on the first electrode layer.

Example 2. The method of example 1, wherein the first electrode layer comprises a metal, a metal alloy, a metal nitride, and/or a metal carbide.

Example 3. The method of example 2, wherein the metal is selected from the group consisting of titanium (Ti), molybdenum (Mo), and tantalum (Ta).

Example 4. The method of example 2, wherein the metal alloy is selected from the group consisting of TiAl and TiW.

Example 5. The method of example 2, wherein the metal nitride is selected from the group consisting of TiN, TaN, WN, and MoN.

Example 6. The method of example 2, wherein the metal carbide is TiC.

Example 7. The method of any one of the preceding examples, wherein the first electrode layer is formed to have a thickness of between 5 nanometers and 100 nanometers, such as between 10 nanometers and 50 nanometers.

Example 8. The method of any one of the preceding examples, wherein the implanted work function adjusting atoms comprise nitrogen (N) atoms and/or fluorine (F) atoms, such as one of nitrogen (N) atoms or fluorine (F) atoms.

Example 9. The method of any one of the preceding examples, wherein an implantation dose of the work function adjusting atoms is between $1E14$ cm$^{-2}$ and $1E17$ cm$^{-2}$, between $5E14$ cm$^{-2}$ and $5E15$ cm$^{-2}$, and/or between $1E15$ cm$^{-2}$ and $5E15$ cm$^{-2}$.

Example 10. The method of any one of the preceding examples, wherein the second electrode layer comprises one of tungsten (W) or doped polysilicon.

Example 11. The method of any one of the preceding examples, wherein the method comprises forming the body region before forming the gate dielectric, and wherein forming the body region comprises implanting dopant atoms via a first surface into the semiconductor body, and activating the implanted dopant atoms.

Example 12. The method of example 11, wherein an implantation dose of the dopant atoms is less than $1.3E13$ cm$^{-2}$ and/or less than $1.2E13$ cm$^{-2}$.

Example 13. The method of any one of examples 1 to 12, wherein the gate dielectric and the gate electrode are formed in a trench of the semiconductor body, wherein the gate dielectric and the first electrode layer are formed in the trench such that a residual trench remains (e.g., the residual trench may correspond to a portion of the trench that remains empty after the gate dielectric and the first electrode layer are formed), and wherein the second electrode layer is formed such that the residual trench is filled (e.g., the second electrode layer fills the residual trench).

Example 14. The method of any one of examples 1 to 12, wherein the gate dielectric and the gate electrode are formed above a first surface of the semiconductor body.

Example 15. The method of any one of the preceding examples, wherein forming the gate dielectric comprises depositing an oxide layer; and wherein the method comprises performing an annealing process (e.g., the annealing process may be performed after forming the gate dielectric to improve the quality of an interface between the semiconductor body and the gate dielectric).

Example 16. The method of example 15, wherein the oxide layer comprises silicon oxide.

Example 17. A SiC MOSFET, comprising at least one transistor cell, wherein the at least one transistor cell comprises: a gate dielectric adjoining a body region; and a gate electrode adjoining the gate dielectric, wherein a work function of the gate electrode is greater than 4.1 eV.

Example 18. The SiC MOSFET according to example 17, wherein the gate electrode comprises a first electrode layer adjoining the gate dielectric; and a second electrode layer on top of the first electrode layer, wherein the first electrode layer comprises implanted work function adjusting atoms.

Example 19. The SiC MOSFET according to example 17 or 18, wherein the first electrode layer has a thickness of between 5 nanometers and 100 nanometers, such as between 10 nanometers and 50 nanometers.

Example 20. The SiC MOSFET according to any one of examples 17 to 19, wherein the implanted work function adjusting atoms comprise nitrogen (N) atoms and/or fluorine (F) atoms, such as one of nitrogen (N) atoms or fluorine (F) atoms.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

The invention claimed is:

1. A method for forming a silicon carbide (SiC) metal-oxide-semiconductor field-effect transistor (MOSFET), wherein the method comprises:
   forming a gate dielectric that adjoins a body region arranged in a semiconductor body; and
   forming a gate electrode on the gate dielectric, wherein forming the gate electrode comprises:
   forming a first electrode layer;
   implanting work function adjusting atoms into the first electrode layer; and
   after implanting the work function adjusting atoms into the first electrode layer, forming a second electrode layer on the first electrode layer.

2. The method of claim 1,
wherein the first electrode layer comprises at least one of a metal, a metal alloy, a metal nitride, or a metal carbide.

3. The method of claim 1,
wherein the first electrode layer comprises a metal selected from the group consisting of titanium (Ti), molybdenum (Mo), and tantalum (Ta).

4. The method of claim 1,
wherein the first electrode layer comprises a metal alloy selected from the group consisting of titanium aluminide (TiAl) and tungsten titanium (TiW).

5. The method of claim 1,
wherein the first electrode layer comprises a metal nitride selected from the group consisting of titanium nitride (TiN), tantalum nitride (TaN), tungsten nitride (WN), and molybdenum nitride (MoN).

6. The method of claim 1,
wherein the first electrode layer comprises titanium carbide (TIC).

7. The method of claim 1,
wherein the first electrode layer is formed to have a thickness of between 5 nanometers and 100 nanometers.

8. The method of claim 1,
wherein the implanted work function adjusting atoms comprise at least one of nitrogen (N) atoms or fluorine (F) atoms.

9. The method of claim 1,
wherein an implantation dose of the work function adjusting atoms is:
between 1E14 centimeters$^{-2}$ (cm$^{-2}$) and 1E17 cm$^{-2}$.

10. The method of claim 1,
wherein the second electrode layer comprises one of tungsten (W) or doped polysilicon.

11. The method of claim 1,
wherein the method comprises forming the body region before forming the gate dielectric, and
wherein forming the body region comprises implanting dopant atoms via a first surface into the semiconductor body, and activating the implanted dopant atoms.

12. The method of claim 11, wherein an implantation dose of the dopant atoms is less than 1.3E13 centimeters$^{-2}$ (cm$^{-2}$).

13. The method of claim 1, wherein the gate dielectric and the gate electrode are formed in a trench of the semiconductor body, wherein the gate dielectric and the first electrode layer are formed in the trench such that a residual trench remains, and wherein the second electrode layer is formed such that the residual trench is filled.

14. The method of claim 1, wherein the gate dielectric and the gate electrode are formed above a first surface of the semiconductor body.

15. The method of claim 1, wherein forming the gate dielectric comprises depositing an oxide layer; and wherein the method comprises performing an annealing process.

16. The method of claim 15, wherein the oxide layer comprises silicon oxide.

17. The method of claim 1, wherein forming the second electrode layer on the first electrode layer after implanting the work function adjusting atoms into the first electrode layer is associated with reducing an on-resistance of the SiC MOSFET without reducing a threshold voltage of the SiC MOSFET by more than a threshold amount.

\* \* \* \* \*